US005861809A

United States Patent [19]

Eckstein et al.

[11] Patent Number: 5,861,809

[45] Date of Patent: Jan. 19, 1999

[54] DEACTIVATEABLE RESONANT CIRCUIT

[75] Inventors: Eric Alan Eckstein, Merion Station; Lawrence Appalucci, Villanova, both of Pa.; Gary Thomas Mazoki, Sewell, N.J.

[73] Assignee: Checkpoint Systems, Inc., Thorofare, N.J.

[21] Appl. No.: 934,979

[22] Filed: Sep. 22, 1997

[51] Int. Cl.[6] ............................ G08B 13/187; H05K 3/32

[52] U.S. Cl. ........................... 340/572; 29/592.1; 29/623; 29/843; 336/200; 336/232; 343/895; 361/767

[58] Field of Search ............................ 340/572; 361/767; 336/200, 232; 343/895; 29/592.1, 623, 843

[56] References Cited

U.S. PATENT DOCUMENTS

| | | | |
|---|---|---|---|
| 3,810,147 | 5/1974 | Lichtblau | 340/572 |
| 3,863,244 | 1/1975 | Lichtblau | 340/572 |
| 3,967,161 | 6/1976 | Lichtblau | 361/765 |
| 4,021,705 | 5/1977 | Lichtblau | 361/765 |
| 4,498,076 | 2/1985 | Lichtblau | 340/572 |
| 4,567,473 | 1/1986 | Lichtblau | 340/572 |
| 4,835,524 | 5/1989 | Lamond et al. | 340/572 |
| 4,920,335 | 4/1990 | Andrews | 340/572 |
| 5,081,445 | 1/1992 | Gill et al. | 340/572 |
| 5,276,431 | 1/1994 | Piccoli et al. | 340/572 |
| 5,708,419 | 1/1998 | Isaacson et al. | 340/572 |

*Primary Examiner*—Glen Swann

*Attorney, Agent, or Firm*—Panitch Schwarze Jacobs & Nadel, P.C.

[57] ABSTRACT

A resonant tag used with an electronic article surveillance system for detecting the presence of the tag within a surveilled area utilizing electromagnetic energy at a frequency within a predetermined detection frequency range includes a resonant circuit capable of resonating at a frequency within the predetermined detection frequency range. The resonant circuit includes an inductor formed at least in part on a surface of a dielectric substrate of the tag. The inductor is formed with a discontinuity or gap, causing an electrical open circuit. The open circuit is closed with a fuse secured proximate to the gap and wirebonded to the portions of the inductor proximate to the gap. The fuse is melted by a current greater than a predetermined level flowing therethrough. Such a high current may be induced in the inductor by an external electromagnetic field. Melting of the fuse causes an open circuit condition, which alters the frequency at which the tag resonates.

33 Claims, 4 Drawing Sheets

DEACTIVATEABLE RESONANT CIRCUIT

BACKGROUND OF THE INVENTION

The present invention relates to resonant circuits and, more particularly, deactivateable resonant security tags for use with electronic security and other systems for the detection of unauthorized removal of articles.

Electronic article surveillance (EAS) systems for detecting and preventing theft or unauthorized removal of articles or goods from retail establishments and/or other facilities, such as libraries, are well known and widely used. In general, such security systems employ a label or security tag which is affixed to, associated with, or otherwise secured to an article or item to be protected or its packaging. Security tags may take on many different sizes, shapes, and forms, depending on the particular type of security system in use, the type and size of the article, etc. In general, such security systems detect the presence of an active security tag as the security tag (and thus the protected article) passes through a surveillance zone or passes by or near a security checkpoint.

Certain prior art security tags work primarily with radio frequency (RF) electromagnetic field disturbance sensing electronic security systems, such as, but not limited to those disclosed in U.S. Pat. No. 3,810,147 entitled "Electronic Security System", U.S. Pat. No. 3,863,244 entitled "Electronic Security System Having Improved Noise Discrimination", and U.S. Pat. No. 5,276,431 entitled "Security Tag For Use With Article Having Inherent Capacitance", and their commercially available implementations and counterparts. Such electronic security systems generally establish an electromagnetic field in a controlled area through which articles must pass when being removed from the controlled premises. A tag having a resonant circuit is attached to each article, and the presence of the resonant circuit in the controlled area is sensed by a receiving system to denote the unauthorized removal of an article. The resonant circuit can be deactivated, detuned, shielded, or removed by authorized personnel from any article authorized (i.e. purchased or checked out) to be removed from the premises, thereby permitting passage of the article through the controlled area without alarm activation.

Security tags can be affixed to or associated with the article being secured or protected in variety of manners. Removal of a tag which is affixed to an article can be difficult and time consuming and, in some cases, requires additional removal equipment and/or specialized training. Detuning the security tag, for instance, by covering it with a special shielding device such as a metallized sticker, is also time consuming and inefficient. Furthermore, both of these deactivation methods require the security tag to be identifiable and accessible, which prohibits the use of tags embedded within merchandise at undisclosed locations or tags concealed in or upon the packaging.

The trend in the electronic article surveillance industry now is to install the tag in a product at the time the product is being manufactured, since at this stage, it is relatively inexpensive to install the tag and because the tag may be concealed or hidden from view. Embedding the tag in the product or the product packaging requires that the tag be remotely deactivateable.

Electronic deactivation involves altering or changing the frequency at which the tag circuit resonates, or preventing the tag circuit from resonating altogether, so that the tag is no longer detected as it passes through the surveillance zone. Such tags can be conveniently deactivated at a checkout counter or other such location by being momentarily placed above or near a deactivation device which subjects the tag to electromagnetic energy at a power level sufficient to cause one or more components of the security tag's resonant circuit to either short circuit or open, depending upon the detailed structure of the tag.

There are many methods available for achieving electronic deactivation. One method of deactivation involves shorting the tag's resonant circuit. This type of electronically deactivateable tags include a weak link created by forming a dimple in the tag which brings more closely together plates of a capacitor formed by the metallizations of two different parts of the tag's resonant circuit on opposite sides of the tag substrate, thereby allowing electrical breakdown at moderate power levels. Such a breakdown causes a short circuit between the two metallizations.

Another deactivation method is disclosed in U.S. Pat. No. 4,021,705 to Lichtblau, which discloses a tag resonant circuit having a fusible link which bridges one or more turns of a planar inductor. Referring to FIG. 1, a conductive path 10 which forms a part of a turn of an inductor of a resonant circuit includes a fusible link 12. The fusible link 12 comprises a narrowed or necked-down portion of the conductive path 10. The fusible link 12 is burned out by the application of energy higher than that employed for detection to either activate or deactivate the tuned circuit. That is, the fusible link 12 is dimensioned to fuse upon flow of a predetermined high current therethrough caused by an applied electromagnetic field, which short circuits the inductor. Shorting the inductor lowers the Q of the resonant circuit, which increases its resonant frequency. Although effective, this method requires relatively high current to break the fuse. In addition, it is often difficult to consistently and repeatedly form such a fuse using standard macro etching techniques generally used to fabricate the tags.

Yet another deactivation method is disclosed in U.S. Pat. No. 4,835,524 to Lamond et al. Referring to FIG. 2, a conductive path 14 includes a gap or break which is bridged by a fuse 16. The fuse 16 comprises a conductive material, such as a conductive ink mixed with an accelerator substance, such as potassium permanganate, which acts as an explosive-type agent to mechanically assist the opening of the fuse. This is known as an explosive type of fuse. The inclusion of the accelerator substance makes the fuse 16 very sensitive to induced current.

There is a need for a tag having a deactivateable resonant circuit which is effective, can be deactivated using moderate power, and may be manufactured at a very low cost.

SUMMARY OF THE INVENTION

Briefly stated, in a first preferred embodiment, the present invention is a resonant tag comprising a dielectric substrate having first and second opposite principal surfaces;

a resonant circuit which resonates when exposed to electromagnetic energy at a frequency within a predetermined detection frequency range, the resonant circuit comprising at least one conductive layer formed on one of the principal surfaces of the dielectric substrate, wherein the conductive layer includes a gap which forms an electrical open circuit;

a fuse structure including a fuse strip positioned proximate to the gap; and an electrical connector connecting the fuse structure to the conductive layer such that the connector and the fuse structure electrically close the gap, wherein a current above a predetermined level flowing through the fuse structure melts the fuse strip, thereby altering the resonant frequency of the resonant circuit such that the resonant circuit no longer resonates at a frequency within the predetermined detection frequency range.

In a second preferred embodiment, the present invention is a fuse structure for use with a resonant tag having a resonant circuit which resonates when exposed to electromagnetic energy at a frequency within a predetermined detection frequency range. The fuse structure comprises a carrier, at least one fuse strip located on a surface of the carrier, and first and second bonding pads connected to respective opposing ends of the at least one fuse strip.

In a further embodiment, the present invention is an activateable/deactivateable resonant tag for use with an electronic security system having means for detecting the presence of a security tag within a surveilled area utilizing electromagnetic energy at a frequency within a predetermined detection frequency range. The tag comprises:

a dielectric substrate having first and second opposite principal surfaces;

at least one resonant circuit disposed on the substrate capable of resonating at a frequency within the predetermined detection frequency range, the resonant circuit including an inductor formed at least in part on one of the principal surfaces of the substrate, wherein the resonant circuit includes a gap forming an electrical open circuit condition;

a fuse structure including at least one fuse strip located on a surface of a carrier and connected to first and second bonding pads of the carrier by respective wedges of conductive material, the fuse structure positioned proximate to the gap; and first and second wires respectively connected to the first and second carrier bonding pads and to the resonant circuit, such that the first and second wires and the fuse structure electrically close the gap, wherein a current greater than a predetermined level flowing through the fuse structure melts the fuse strip, thereby altering the resonant frequency of the resonant circuit.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred, it being understood, however, that the invention is not limited to the precise arrangement and instrumentalities disclosed. In the drawings.

DETAILED DESCRIPTION OF THE INVENTION

Figure 1:
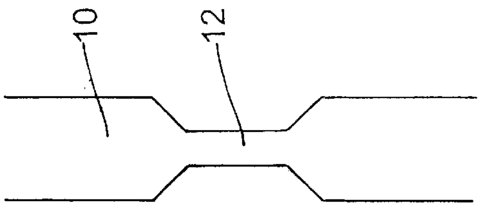
Fig. 1 (PRIOR ART)
FIG. 1 is an enlarged plan view of a portion of a conductive pattern on one side of a first prior art printed circuit security tag.
Figure 2:
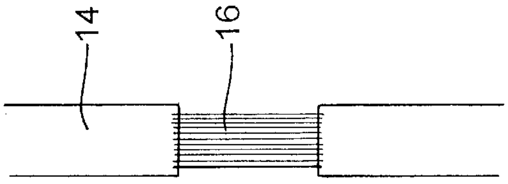
Fig.2 (PRIOR ART)
FIG. 2 is an enlarged plan view of a portion of a conductive pattern on one side of a second prior art printed circuit security tag.

Certain terminology is used in the following description for convenience only and is not limiting. The words "top", "bottom", "lower" and "upper" designate directions in the drawings to which reference is made. The term "use" or "normal use", when used in reference to an article or product having a tag embedded therein, refers to the usage of the article or product over the life of the product. That is, all care and usage of the product from the time the product is manufactured until the product is discarded. The terminology includes the words above specifically mentioned, derivatives thereof and words of similar import. In the drawings, the same reference numeral designations are applied to corresponding elements throughout the several figures.

The present invention is directed to a resonant circuit which may be used with an electronic article surveillance (EAS) system. The system is designed to induce and detect a resonant condition in the circuit. That is, the circuit resonates at a frequency within a predetermined detection frequency range when it is exposed to electromagnetic energy. The circuit is constructed on a dielectric substrate in the form of a tag, as is known to those of ordinary skill in the art and as described in one or more of the above-cited patents, each of which is incorporated herein by reference.

Figure 3:
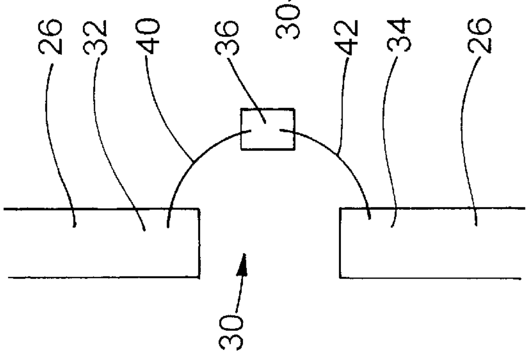
FIG. 3 is an enlarged plan view of a portion of a conductive pattern on one side of a printed circuit security tag in accordance with a first embodiment of a security tag of the present invention.
Figure 6:
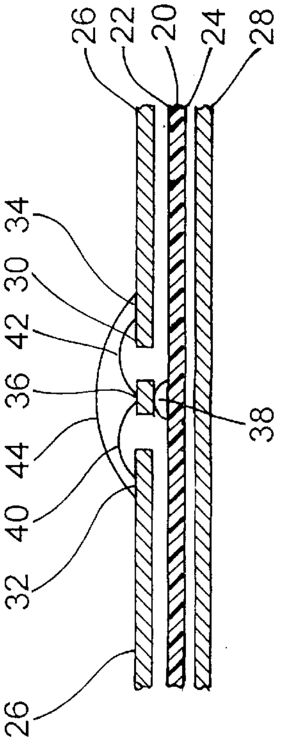
FIG. 6 is a diagrammatic cross-sectional view of the fuse secured to the substrate and wirebonded to the conductive pattern of FIG. 3.

Referring now to FIGS. 3 and 6, a first embodiment of a portion of a deactivateable tag resonant circuit in accordance with the present invention is shown. In its preferred embodiment, the tag comprises a generally square, planar insulative or dielectric substrate 20 (FIG. 6) having a first principal surface or top side 22 and a second, opposite principal surface or bottom side 24. The substrate material may be any solid material or composite structure of materials so long as it is insulative and can be used as a dielectric. Preferably the substrate 20 is formed of an insulated dielectric material of a type well known in the art, for example, a polymeric material such as polyethylene. However, it will be recognized by those skilled in the art that other dielectric materials may alternatively be employed in forming the substrate 20. Further, the shape of the substrate and/or tag is not a limitation, as the tag may have virtually any shape, such as such as oval, circular, triangular, etc.

The tag further comprises circuitry means located on the substrate 20 for establishing at least one resonant circuit by forming predetermined circuit elements or components. As previously discussed, the circuitry means is designed to resonate when exposed to electromagnetic energy at a frequency within a predetermined detection frequency range. The circuit elements and components are usually formed on both principal surfaces of the substrate 20 by patterning conductive material, as is well known in the art.

In a preferred embodiment, the resonant circuit is formed by the combination of a single inductive element, inductor, or coil L electrically connected with a single capacitive element or capacitance in a series loop, as shown and described in the aforementioned U.S. Pat. No. 5,276,431, which is hereby incorporated by reference. The inductor is formed at least in part on one of the principal surfaces of the substrate 20. In FIGS. 3 and 6, the inductor is shown formed on the first principal surface 22 of the substrate 20. However, it will be understood by those of ordinary skill in the art that the inductor could be formed on either side or surface of the substrate 20. The inductor comprises a first conductive pattern 26 formed in the shape of a spiral on the first principal surface 22 of the substrate 20, which surface is arbitrarily selected as the top surface of the tag. The resonant circuit further comprises a second conductive pattern 28 imposed on the opposite or second side or surface 24 of the substrate 20, sometimes referred to as the back or bottom surface. The conductive patterns 26, 28 may be formed on the substrate surfaces 22, 24 respectively, with electrically conductive materials of a known type and in a manner which is well known in the electronic article surveillance art. It will be appreciated by those skilled in the art that the actual shape of the inductor coil may be varied so long as appropriate inductive elements and values are provided to allow the circuit to resonate within the predetermined resonant frequency when activated.

The conductive material is preferably patterned by a subtractive process (i.e. etching), whereby unwanted material is removed by chemical attack after desired material has been protected, typically with a printed on etch resistant ink. In the preferred embodiment, the conductive material is aluminum or aluminum foil. However, other conductive materials (e.g., gold, nickel, copper, phosphor bronzes, brasses, solders, high density graphite or silver-filled conductive epoxies) can be substituted for aluminum without changing the nature of the resonant circuit or its operation.

The first and second conductive patterns 26, 28 establish at least one resonant circuit having a resonant frequency within the predetermined detection frequency range of an electronic article surveillance system used with the tag. The tag may be manufactured by processes described in U.S. Pat. No. 3,913,219 entitled “Planar Circuit Fabrication Process”, which is incorporated herein by reference. However other manufacturing processes can be used, and nearly any method or process of manufacturing circuit boards could be used to make the tag. In one embodiment of the tag, the conductive pattern 26 which forms the coil lines of the inductor are approximately 0.04 of an inch wide and are spaced apart by approximately 0.015 of an inch.

According to the present invention, the resonant circuit includes at least one open circuit, preferably formed by a gap 30 in the conductive pattern 26 which forms the inductor coil, such that a discontinuity is formed in the inductor coil. The gap 30 defines a first coil area 32 and a second coil area 34 on the opposing portions or sides of the conductive pattern 26 adjacent to the gap 30. The gap 30 is preferably between about 0.010 of an inch to about 0.015 of an inch wide and may be formed by etching at the time the coil is formed.

Figure 4:
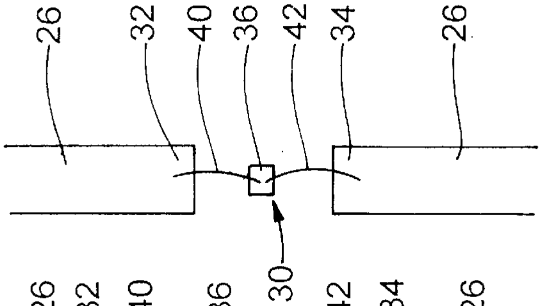
FIG. 4 is an enlarged plan view of a fuse positioned between a gap in an inductor coil of a resonant circuit in accordance with the present invention.
Figure 5:
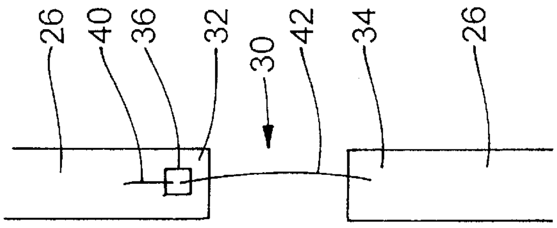
FIG. 5 is an enlarged plan view of a fuse positioned on an inductor coil of a resonant circuit proximate to a gap in the resonant coil in accordance with the present invention.

A fuse structure 36 is positioned proximate to the gap 30 and is secured to the resonant tag, such as by gluing. Preferably the fuse structure 36 is attached or secured to the resonant tag with an encapsulant material, such as a small amount of ultra-violet (UV) curable epoxy 38 (FIG. 6). Referring to FIG. 3, the fuse structure 36 is shown positioned adjacent to a lateral side of the first conductive pattern 26 proximate to the gap 30 in the conductive pattern 26, and is secured to the substrate 20. The fuse structure 36 may also be positioned within the gap 30, as shown in FIG. 4. Alternatively, and as is presently preferred, the fuse structure 36 may be positioned and secured to a portion of the conductive pattern 26 on one side of the gap 30, such as within the first coil area 32, as shown in FIG. 5. It is preferred to position the fuse structure 36 on the conductive pattern 26 because the conductive pattern provides additional support for the fuse structure 36 when the fuse structure 36 is secured thereto. Although it is presently preferred that the gap 30 is located in the inductor coil and that the fuse structure 36 is positioned proximate thereto, it will be understood by those of ordinary skill in the art that fuse structure 36 could be attached at other locations, such as any conductive area. For instance, the fuse structure 36 could be attached to a capacitor plate of the resonant circuit (not shown).

An electrical connector connects the fuse structure 36 to the conductive pattern 26 such that the connector and the fuse structure 36 electrically close the gap 30 (i.e. completing the circuit). In the presently preferred embodiment, the electrical connector comprises first and second wires 40, 42 bonded to the first and second coil areas 32, 34, respectively proximate to the gap 30, and to the fuse structure 36. The wires 40, 42 may be wire bonded to the conductive pattern 26 and to the fuse 36 using an ultrasonic aluminum wedge wire bonding technique, as is known to those skilled in the art of semiconductor packaging. In order to protect the wire bonds and the wires 40, 42, the fuse structure 36, wires 40, 42 and first and second coil areas 32, 34 may be covered with an encapsulant 44 (FIG. 6), such as the UV curable encapsulant material used to secure the fuse structure 36 to the substrate 20 (or the conductive pattern 26). The encapsulant 44 protects the wire bonds from physical damage during processing and handling.

The resonant circuit, including the fuse structure 36, is altered through the use of remote electronic devices. Such circuit alteration may occur, for example, at a manufacturing facility, a distribution facility or at a checkout counter, and may be performed to either activate or deactivate the resonant circuit. Frequency shifting, which typically occurs at the manufacturing facility, changes the frequency at which the resonant circuit resonates. Deactivation usually occurs at the checkout counter when a person purchases an article with an affixed or embedded security tag. Deactivation of the tag resonant circuit prevents the resonant circuit from resonating so that the electronic security system no longer detects when an article with the tag attached passes through the surveillance zone of the electronic security system. Deactivation involves exposing the tag to an energy level which is sufficiently high to induce a current to flow through the inductor which is sufficiently large to melt a fuse strip of the fuse structure 36 such that the first and second coil areas 32, 34 are no longer electrically connected (i.e. an open circuit condition), which alters the circuit resonance characteristics. For instance an energy level exceeding 14 volts (peak to peak) induced into the tag, has been found to induce a sufficiently high current to melt the fuse strip. That is, the open circuit condition prevents the resonant circuit from resonating at a frequency within the predetermined detection frequency range, or prevents the circuit from resonating at all. As will be understood by those of ordinary skill in the art, the present invention may be used in conjunction with other means of altering the resonant frequency of the tag circuit, such as a means for short circuiting a capacitor of the resonant circuit.

Figure 7:
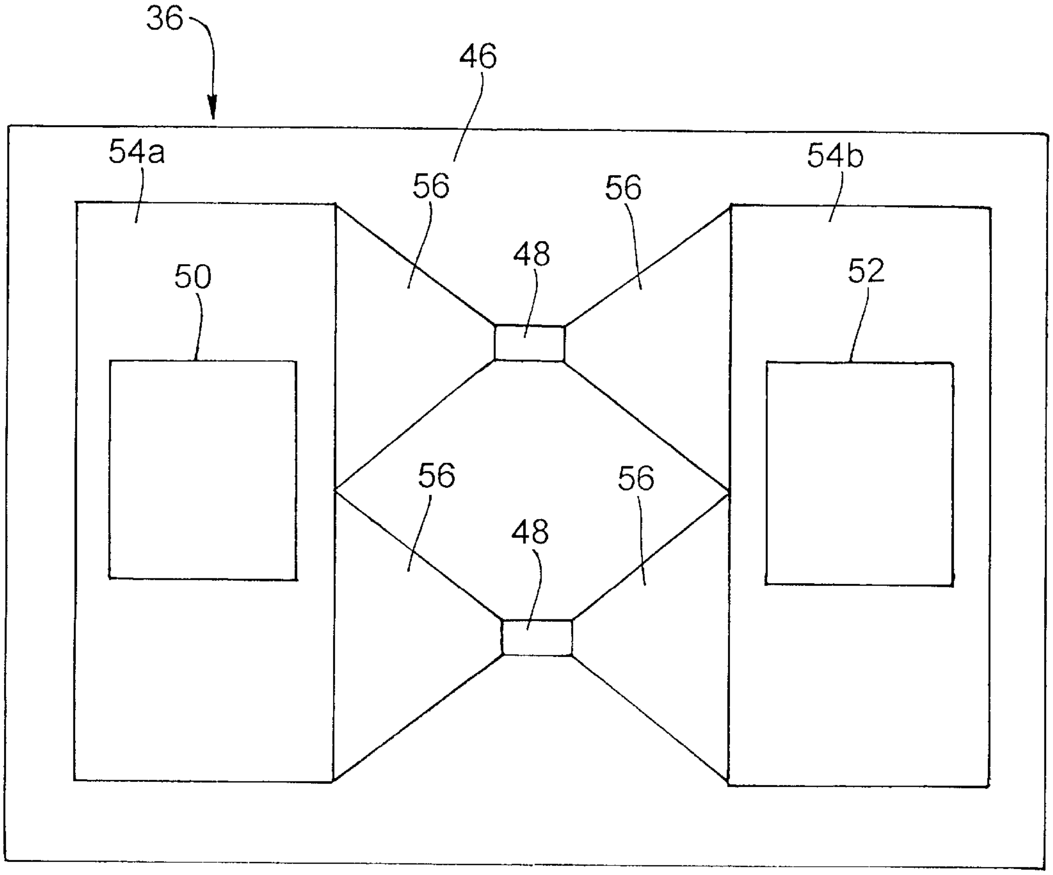
FIG. 7 is a greatly enlarged top plan view of a fuse structure in accordance with the present invention.

Referring now to FIG. 7, the fuse structure 36 preferably comprises a conductor or conductive material, such as aluminum, disposed or deposited on a non-conductive or semiconductive carrier 46. The carrier 46 may be constructed of a nonconductive material, such as silicon, or a semiconductive material, such as poly-silica or alumina. The fuse structure further comprises at least one fuse strip 48, and first and second bonding pads 50, 52 connected to respective opposing ends of the fuse strip(s) 48. The fuse strip 48 preferably comprises a metalization layer on a principal surface of the carrier 46. The bonding pads 50, 52 comprise a passivation layer opening located on a metal layer 54*a*, 54*b* and are preferably connected to the fuse strip(s) 48 via respective generally triangular shaped layers 56 of conductive material disposed on the surface of the carrier 46.

The fuse structure 36 is very small in size, and in the presently preferred embodiment, is less than about 0.01 of an inch square. However, the fuse structure 36 is relatively easy to manufacture, since well refined microelectronic processes are used to construct the fuse structure 36. An example fuse structure 36 was fabricated in which the metal layers 54*a*, 54*b* are approximately 229 microns by 90 microns and the bonding pads are approximately 89 microns by 70 microns. The two fuse strips 48, as shown in FIG. 7, measure about 1.5 microns by 3.0 microns, and the generally triangular shaped layers 56 of conductive material have a height of about 115 microns and a width of about 23 microns. Such small sizing relative to the size of the conductive pattern 26 ensures that the fuse 36 functions according to its intended purpose, but is large enough to allow the resonant circuit to resonate when exposed to an interrogation signal, without breaking or melting the fuse strips 48. Although the fuse structure 36 shown in FIG. 7 includes two fuse strips 48, it will be understood by those of ordinary skill in the art that the fuse structure 36 may have either one or a plurality of such fuse strips. Moreover, although the fuse strips 48 are shown as being generally rectangular in shape, the fuse strips 48 could comprise other shapes, such as circular, cylindrical or a polygon. Further, the generally triangular shaped layers 56 of conductive material need not necessarily be triangular, but could be otherwise shaped, including cylindrical, rectangular, etc.

Figure 8:
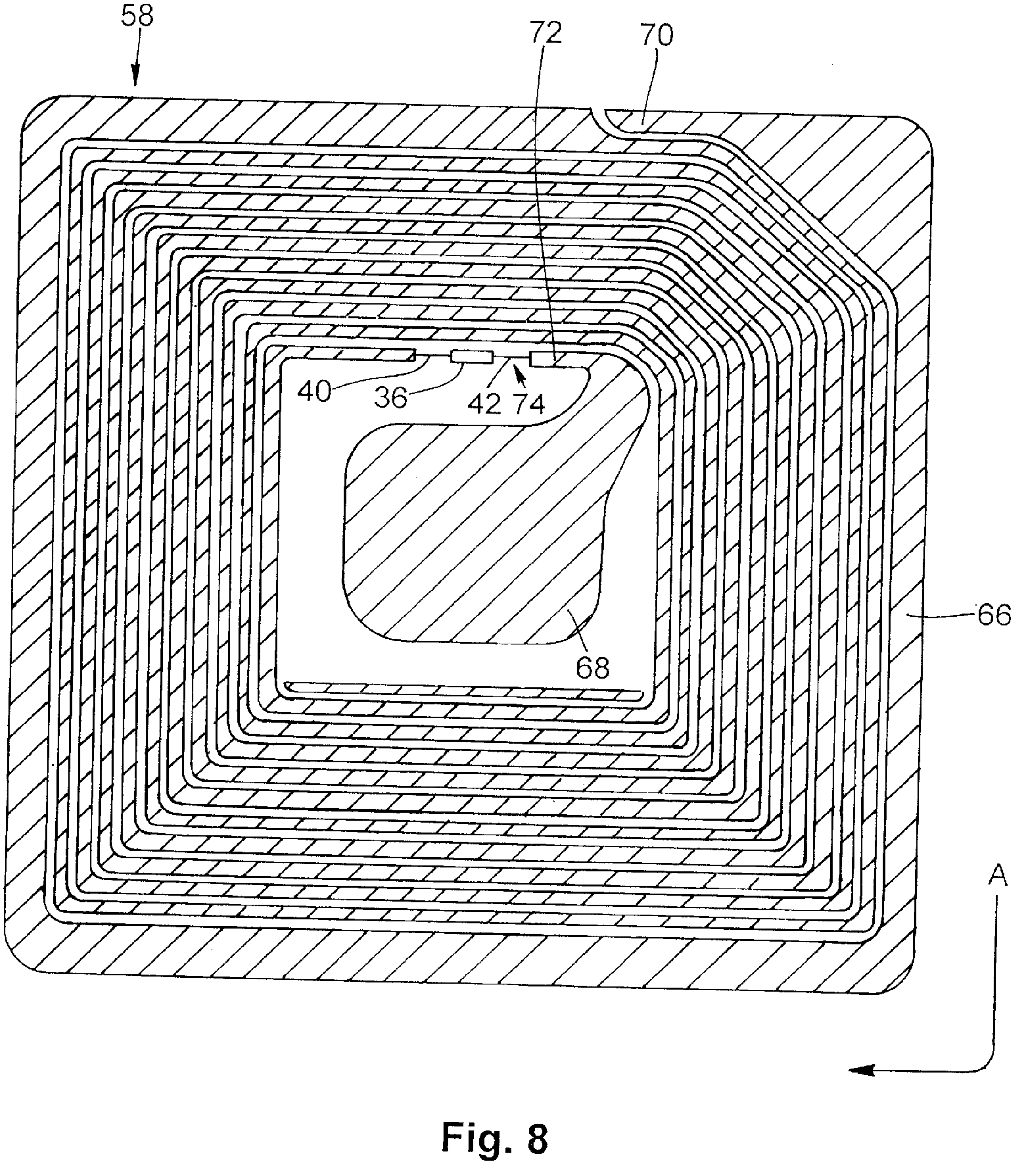
FIG. 8 is a greatly enlarged top plan view of a resonant tag including the fuse structure of FIG. 7.

FIG. 8 is an enlarged top plan view of a resonant tag 58 including the fuse structure 36 of the present invention. The tag resonant circuit includes an inductive coil 66 formed by a conductive layer on a surface of a substrate and a capacitor formed by aligned plates on respective sides of the tag 58. One of the capacitor plates is shown in FIG. 8, at 68. The inductive coil 66 is formed generally in the shape of a spiral having a first, outer end 70 proximate to an outer edge of the tag 58 and a second, inner end 72 proximate a central area of the tag 58. The arrow A denotes the direction of the spiral, which coils from the outside of the tag 58 to an inner or central region of the tag 58.

The coil 66 includes a gap 74 formed therein, defining a first coil area extending from the coil outer end 70 to the gap 74 and a second coil area extending from the gap 74 to the coil inner end 72. The fuse structure 36 is positioned proximate to the gap 74, as discussed with reference to FIGS. 3–6, and wire bonded with first and second wire bonds 40, 42. Although the fuse structure 36 and the gap 74 are shown located proximate to the inner or central region of the tag 58, it will be understood by those of ordinary skill in the art that the gap 74 may be located in various other locations, such as at the coil outer end 70 or midway between the coil outer end 70 and the coil inner end 72.

Figure 9:
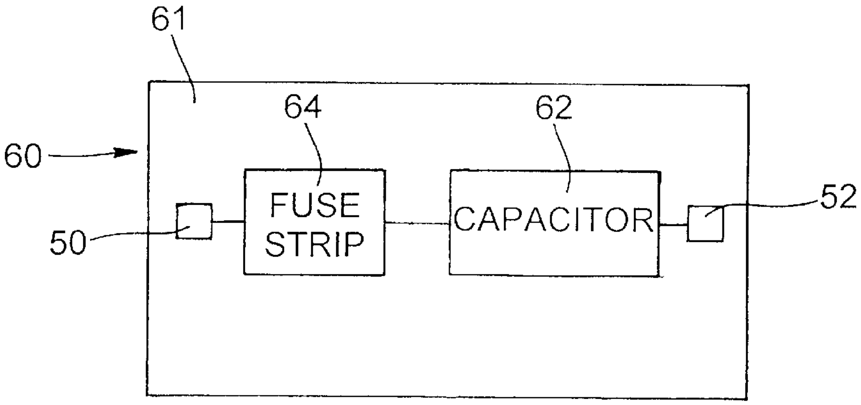
FIG. 9 is a functional block diagram of an alternate embodiment of a fuse structure in accordance with the present invention.

Referring now to FIG. 9, a schematic diagram of a second embodiment of a fuse structure 60 is shown. The fuse structure 60 comprises a carrier 61 having at least one capacitor 62, such as a surface mount capacitor, electrically connected in series with a fuse strip 64, between opposing first and second bonding pads 50, 52. As is known by those of ordinary skill in the art, a resonant circuit, such as the resonant circuits used in electronic article surveillance systems, include both an inductor and a capacitor.

Figure 10:
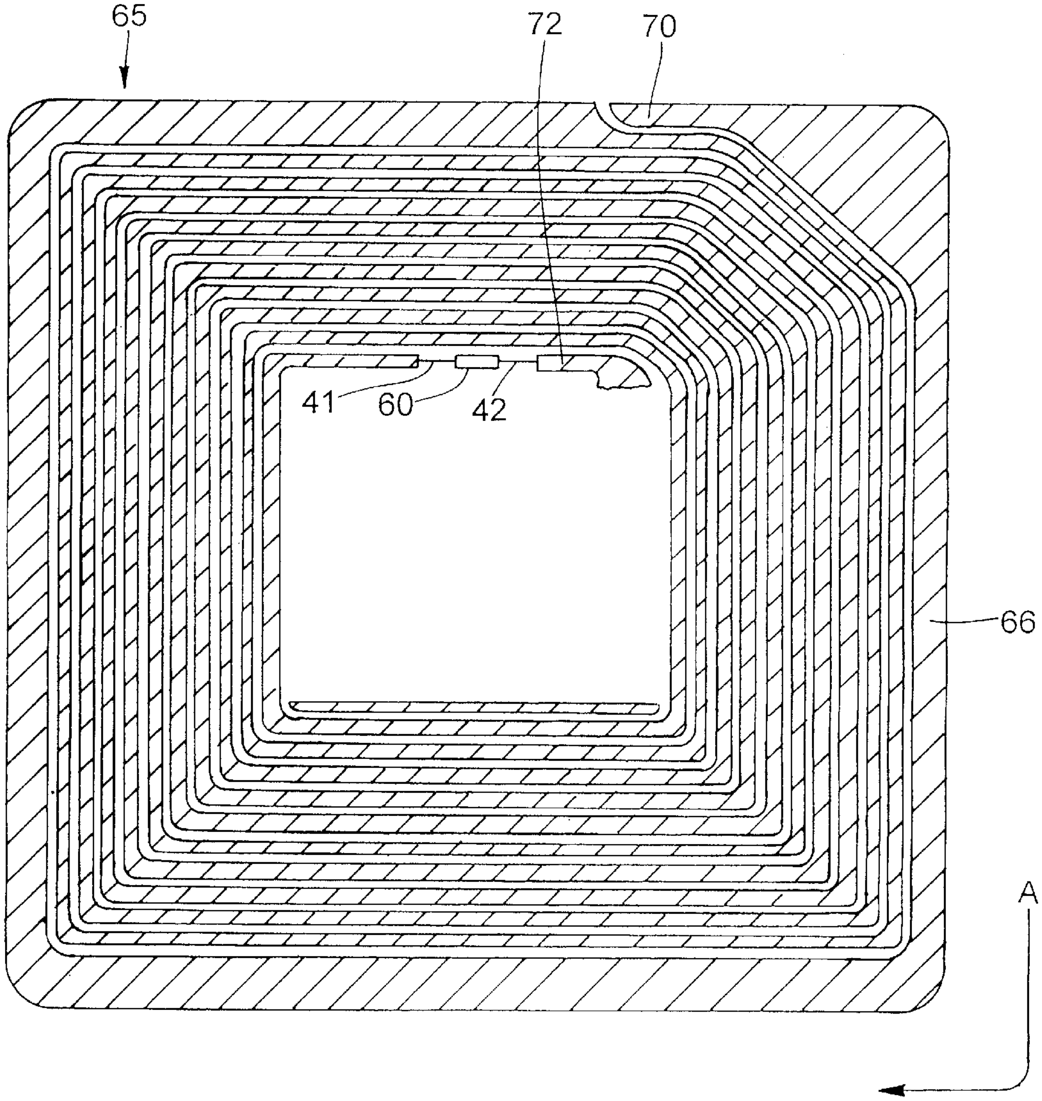
FIG. 10 is a greatly enlarged top plan view of a resonant tag including the fuse structure of FIG. 9.

FIG. 10 is an enlarged top plan view of a resonant tag 65 including the fuse structure 60. The tag resonant circuit includes an inductive coil 66 formed by a conductive layer on a surface of a substrate. However, as opposed to prior art designs in which the capacitor is formed by aligned plates on respective sides of the substrate, the capacitor 62 is now located on the carrier 61 of the fuse structure 60. Thus, the capacitor plates, such as the capacitor plate 68 (FIG. 8) are no longer required, or smaller capacitor plates may be used, as will be understood by those of skill in the art. It is believed to be very advantageous to be able to construct a tag which no longer requires the relatively large capacitor plates traditionally used to form the capacitor in such tags. Eliminating the area required for the capacitor plates allows either a smaller tag to be constructed or a tag with improved detection capabilities.

In order to protect the tag resonant circuit from damage caused when the tag 65, having a static charge, is grounded, and to prevent the fuse strip 64 from prematurely blowing, the fuse structure 60 is preferably connected such that the capacitor 62, is connected to the first coil area (i.e. the coil area between the gap 74 and the coil outer end 70) and the fuse strip 64 is connected to the second coil area, which extends to the coil inner end 72. Thus, if a charge builds up across the capacitor 62 due to static, if the coil 66 is grounded, the charge moves from the capacitor 62 to ground (the outer edge of the coil), does not pass through the fuse strip 64, and is limited by the coil 66, and therefore does not damage or blow the fuse strip 64. Such a tag thus includes built in static protection.

From the foregoing description, it can be seen that the present embodiment comprises a deactivateable resonant tag which may be used with an electronic security system. It will be recognized by those skilled in the art that changes may be made to the above-described embodiment of the invention without departing from the broad inventive concepts thereof. For example, a resonant tag may be constructed which includes a plurality of open circuits and corresponding fuse structures 36/60 and their associated electrical connections, which allow the tag to be activated and/or deactivated by "blowing" the one or more fuse structures. The fuse structure may also be used with other types of resonant tags, such as so-called "hard" tags which are constructed using a coiled wire for the inductor and a discrete capacitor, as opposed to conductive layers. It is understood, therefore, that this invention is not limited to the particular embodiment disclosed, but is intended to cover any modifications which are within the scope and spirit of the invention as defined by the appended claims.

We claim:

1. A resonant tag comprising:

a dielectric substrate having first and second opposite principal surfaces;

a resonant circuit which resonates when exposed to electromagnetic energy at a frequency within a predetermined detection frequency range, the resonant circuit comprising at least one conductive layer formed on one of the principal surfaces of the dielectric substrate, wherein the conductive layer includes a gap which forms an electrical open circuit;

a fuse structure including a fuse strip positioned proximate to the gap; and an electrical connector connecting the fuse structure to the conductive layer such that the connector and the fuse structure electrically close the gap, wherein a current above a predetermined level flowing through the fuse structure melts the fuse strip, thereby altering the resonant frequency of the resonant circuit such that the resonant circuit no longer resonates at a frequency within the predetermined detection frequency range.

2. The resonant tag as recited in claim 1 wherein the electrical connector comprises first and second wires bonded to the conductive layer on opposing sides of the gap, respectively, and to the fuse structure.

3. The resonant tag as recited in claim 2 further comprising an encapsulant covering the fuse structure and the wirebonds.

4. The resonant tag as recited in claim 3 wherein the encapsulant comprises an ultraviolet curable encapsulant.

5. The resonant tag as recited in claim 1 wherein the gap is formed in an inductive coil of the resonant circuit.

6. The resonant tag as recited in claim 5 wherein the fuse structure is positioned within the gap and is secured to the substrate.

7. The resonant tag as recited in claim 6 wherein the fuse structure is secured to the substrate with an encapsulant material.

8. The resonant tag as recited in claim 5 wherein the fuse structure is secured on the conductive layer on one lateral side of the gap.

9. The resonant tag as recited in claim 8 wherein the fuse structure is secured to the conductive layer with an encapsulant material.

10. The resonant tag of claim 1 wherein melting the fuse strip causes an electrical open circuit condition in the resonant circuit which prevents the circuit from resonating.

11. The resonant tag as recited in claim 1 wherein the gap is formed in an inductive coil of the resonant circuit, the fuse structure is secured with an encapsulant material on the conductive layer on one side of the gap, and the electrical connector comprises first and second wires bonded to the conductive layer on opposing sides of the gap, respectively, and to the fuse structure, the tag further comprising an ultraviolet curable encapsulant covering the fuse structure and the wirebonds, wherein melting the fuse strip causes an electrical open circuit condition in the resonant circuit which prevents the circuit from resonating.

12. The resonant tag as recited in claim 1 wherein the resonant circuit includes an inductive coil and a capacitor, the inductive coil being formed by the at least one conductive layer on the substrate and the capacitor being a part of the fuse structure, the capacitor being electrically connected in series with the fuse strip.

13. The resonant tag as recited in claim 12 wherein the inductive coil is formed generally in the shape of a spiral having a first, outer end proximate to an outer edge of the substrate and a second, inner end proximate a central area of the substrate, and the gap is formed in the inductive coil of the resonant circuit defining a first coil area extending from the coil outer end to the gap and a second coil area extending from the gap to the coil inner end and wherein the capacitor is connected to the first coil area and the fuse strip is connected to the second coil area.

14. The resonant tag as recited in claim 1 wherein the fuse structure comprises:

a carrier;

at least one fuse strip located on a surface of the carrier; and first and second bonding pads connected to respective opposing ends of the at least one fuse strip.

15. The resonant tag of claim 14 wherein the carrier comprises a semiconductor material.

16. The resonant tag of claim 15 wherein the semiconductor material comprises silicon.

17. The resonant tag of claim 14 wherein the carrier comprises a non-conductive material.

18. The resonant tag of claim 14 wherein the first and second bonding pads are connected to the at least one fuse strip via respective generally triangular shaped layers of conductive material disposed on the surface of the carrier.

19. The resonant tag as recited in claim 14 wherein the fuse structure is less than approximately 0.01 inches square.

20. A fuse structure for use with a resonant tag having a resonant circuit which resonates when exposed to electromagnetic energy at a frequency within a predetermined detection frequency range, the fuse structure comprising:

a carrier;

at least one fuse strip located on a surface of the carrier; and first and second bonding pads connected to respective opposing ends of the at least one fuse strip.

21. The resonant tag of claim 20 wherein the carrier comprises a semiconductor material.

22. The resonant tag of claim 21 wherein the semiconductor material comprises silicon.

23. The resonant tag of claim 20 wherein the carrier comprises a non-conductive material.

24. The resonant tag of claim 20 wherein the first and second bonding pads are connected to the at least one fuse strip via respective generally triangular shaped layers of conductive material disposed on the surface of the carrier.

25. The resonant tag as recited in claim 20 wherein the fuse structure is less than approximately 0.01 inches square.

26. The resonant tag as recited in claim 25, wherein the fuse strip is about 3.0 microns in length and about 1.50 microns in width.

27. The resonant tag as recited in claim 20 wherein that at least one fuse strip comprises two fuse strips.

28. The resonant tag as recited in claim 20 wherein the at least one fuse strip comprises a plurality of fuse strips, each of the fuse strips being connected to the first and second bonding pads by opposing triangle shaped layers of conductive material disposed on the surface of the carrier.

29. An activateable/deactivateable resonant tag for use with an electronic security system having means for detecting the presence of a security tag within a surveilled area utilizing electromagnetic energy at a frequency within a predetermined detection frequency range, the tag comprising:

a dielectric substrate having first and second opposite principal surfaces;

at least one resonant circuit disposed on the substrate capable of resonating at a frequency within the predetermined detection frequency range, the resonant circuit including an inductor formed at least in part on one of the principal surfaces of the substrate, wherein the resonant circuit includes a gap forming an electrical open circuit condition;

a fuse structure including at least one fuse strip located on a surface of a carrier and connected to first and second bonding pads of the carrier by respective wedges of conductive material, the fuse structure positioned proximate to the gap; and first and second wires respectively connected to the first and second carrier bonding pads and to the resonant circuit, such that the first and second wires and the fuse structure electrically close the gap, wherein a current greater than a predetermined level flowing through the fuse structure melts the fuse strip, thereby altering the resonant frequency of the resonant circuit.

30. The activateable/deactivateable resonant tag of claim 29 further comprising an encapsulant covering the gap, the fuse structure and the first and second wires.

31. The activateable/deactivateable resonant tag of claim 29 wherein melting the fuse strip alters the resonant frequency of the resonant tag so that the resonant circuit resonates at a frequency within the predetermined detection frequency range.

32. The activateable/deactivateable resonant tag of claim 29 wherein melting the fuse strip alters the resonant frequency of the resonant tag so that the resonant circuit resonates at a frequency outside of the predetermined detection frequency range.

33. The activateable/deactivateable resonant tag of claim 29 wherein the fuse structure further comprises at least one capacitor electrically connected in series with the fuse strip.

* * * * *